United States Patent [19]

Moslehi et al.

[11] Patent Number: 5,268,989
[45] Date of Patent: Dec. 7, 1993

[54] MULTI ZONE ILLUMINATOR WITH EMBEDED PROCESS CONTROL SENSORS AND LIGHT INTERFERENCE ELIMINATION CIRCUIT

[75] Inventors: Mehrdad M. Moslehi, Dallas; Robert Matthews, Plano; Cecil J. Davis, Greenville, all of Tex.

[73] Assignee: Texas Instruments Incorporated, Dallas, Tex.

[21] Appl. No.: 870,446

[22] Filed: Apr. 16, 1992

[51] Int. Cl.$^5$ .................. C23C 16/48; H05B 3/00; H01L 21/324
[52] U.S. Cl. .................. 392/418; 118/725; 364/571.03; 315/149
[58] Field of Search ............... 392/418, 416; 219/385, 219/390, 412, 413, 405, 411; 250/492.1, 495.1; 364/557, 571.03; 315/149–159

[56] References Cited

U.S. PATENT DOCUMENTS

| | | | |
|---|---|---|---|
| 4,836,138 | 6/1989 | Robinson et al. | 118/725 |
| 4,859,832 | 8/1989 | Uehara et al. | 219/411 |
| 4,890,245 | 12/1989 | Yomoto et al. | 364/557 |
| 4,956,538 | 9/1990 | Moslehi | 219/405 |
| 4,979,133 | 12/1990 | Arima et al. | 364/557 |
| 4,979,134 | 12/1990 | Arima et al. | 364/557 |
| 4,984,902 | 1/1991 | Crowley et al. | 374/126 |
| 5,098,198 | 3/1992 | Nulman et al. | 374/126 |
| 5,102,231 | 4/1992 | Loewenstein et al. | 374/129 |
| 5,108,792 | 4/1992 | Anderson et al. | 118/725 |
| 5,179,677 | 1/1993 | Anderson et al. | 392/411 |

Primary Examiner—Bruce A. Reynolds
Assistant Examiner—John A. Jeffery
Attorney, Agent, or Firm—Jacqueline J. Garner; Richard L. Donaldson; William E. Hiller

[57] ABSTRACT

A multi-zone illuminator for processing semiconductor wafers comprises a plurality of source lamps and dummy lamps embedded in the reflector side of a lamp housing. The source lamps are arranged in a plurality of concentric circular zones. The illuminator also comprises plurality of light pipes for receiving multi-point temperature sensors to measure the semiconductor wafer temperature and its distribution uniformity. A gold-plated reflector plate is attached to the bottom side of the lamp housing for reflecting and directing optical energy toward the wafer surface. The distance between the reflector plate and the wafer and the lamps and the wafer may be adjusted with the use of a spacial elevator and adaptor assembly. The multi-zone illuminator allows uniform wafer heating during both transient and steady-state wafer heating cycles.

20 Claims, 9 Drawing Sheets

MULTI ZONE ILLUMINATOR WITH EMBEDED PROCESS CONTROL SENSORS AND LIGHT INTERFERENCE ELIMINATION CIRCUIT

NOTICE: INVENTION WAS MADE WITH U.S. GOVERNMENT SUPPORT UNDER CONTRACT NUMBER F33615-88-C-5448 (PROGRAM NAME MMST) AWARDED BY THE UNITED STATES AIR FORCE. THE U.S. GOVERNMENT MAY HAVE CERTAIN RIGHTS IN THIS INVENTION.

CROSS-REFERENCE TO RELATED APPLICATIONS

The following co-assigned patent applications are hereby incorporated herein by reference:

| Ser. No. | Filing Date | TI Case No. |
| --- | --- | --- |
| 690,426 | 4/14/91 | TI-15255 |
| 702,646 | 5/17/91 | TI-15188 |
| 702,792 | 5/17/91 | TI-15844 |
| 785,386 | 10/30/91 | TI-15734 |
| 702,798 | 05/17/91 | TI-15843 |

FIELD OF THE INVENTION

This invention generally relates to semiconductor device processing and more particularly to a multi-zone illuminator with embedded real-time process control sensors for uniform wafer processing in rapid thermal processing reactors.

BACKGROUND OF THE INVENTION

Without limiting the scope of the invention, its background is described in connection with single-wafer rapid thermal processing of semiconductors wafers, as an example.

Single-wafer rapid thermal processing (RTP) of semiconductors is a powerful and versatile technique for fabrication of very-large-scale-integrated (VLSI) and ultra-large-scale-integrated (ULSI) electronic devices. It combines low thermal mass photon-assisted rapid wafer heating with inert or reactive ambient semiconductor wafer processing. Both the wafer temperature and the process environment can be quickly changed and, as a result, each fabrication step can be independently optimized in order to improve the overall electrical performance of the fabricated devices.

Rapid thermal processing (RTP) of semiconductor wafers provides a capability for improved wafer-to-wafer process repeatability in a single-wafer lamp-heated thermal processing reactor. In prior art RTP systems, equipment manufacturers have spent significant design resources to provide uniform wafer heating during the steady-state heating, conditions. These prior art systems are designed with illuminators which provide single-zone or very limited asymmetrical multi-zone control capability. Thus, with an increase or decrease of power to the illuminator, the entire wafer temperature distribution is affected. As a result, there are insufficient real-time adjustment and control capabilities to adjust or optimize wafer temperature uniformity during the steady-state and dynamic transient heat-up and cool-down cycles. As a result, the transient heat-up or cool-down process segments can produce slip dislocations as well as process non-uniformities. Various process parameters can influence and degrade the RTP uniformity. Prior art RTP systems are optimized to provide steady-state temperature uniformity at a fixed pressure. Thus a change in pressure or gas flow rates may also degrade the RTP uniformity.

SUMMARY OF THE INVENTION

Generally, and in one form of the invention, a multi-zone illuminator used in processing of semiconductor wafers is described which comprises a plurality of individual source lamps embedded in the reflector side of a lamp housing. The source lamps are arranged in a plurality of concentric circular zones for generating and directing optical energy. The illuminator also comprises a light interference elimination circuit (LIEC) having a plurality of dummy lamps not used for actual wafer heating. There is at least one dummy lamp for each circular zone which contains a light pipe for receiving a fiber-optic radiance sensor. This fiber-optic radiance sensor measures the radiation from the dummy lamps. It is also possible to use a single dummy lamp for all zones. However, the use of one dedicated dummy lamp for each zone is preferred. A gold-plated reflector plate is attached to the bottom side of the lamp housing for reflecting and directing optical energy. The distance between the reflector plate and the wafer and the lamps and the wafer may be adjusted with the use of an adjustable elevator (for lamp-to-wafer spacing and an adjustable adaptor between the lamp housing and the process chamber.

An advantage of the invention is uniform wafer heating over a wide range of gas pressures and flow rates using the concentric multi-zone configuration.

A further advantage of the invention is the use of adjustable reflector-to-wafer and lamp-to-wafer spacings.

A further advantage of the invention is providing the means for implementation of multi-point temperature sensors and light interference elimination components with minimum space and packaging complexity.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The continuing down scaling of device dimensions in VLSI/ULSI circuits places increasingly challenging demands on the manufacturing tools and technologies required to manufacture complex microelectronic devices. Rapid technology advancements have reduced the minimum feature sizes of digital integrated circuits into the submicron regime. As a result, short-time and or activated low temperature processes are considered to be essential for minimizing the dopant distribution problems, increasing the device fabrication yield, and achieving enhanced process control during the device fabrication sequence.

RTP operates based on the single-wafer processing methodology which is considered desirable for flexible fast turn-around integrated circuit manufacturing.

Figure 1:
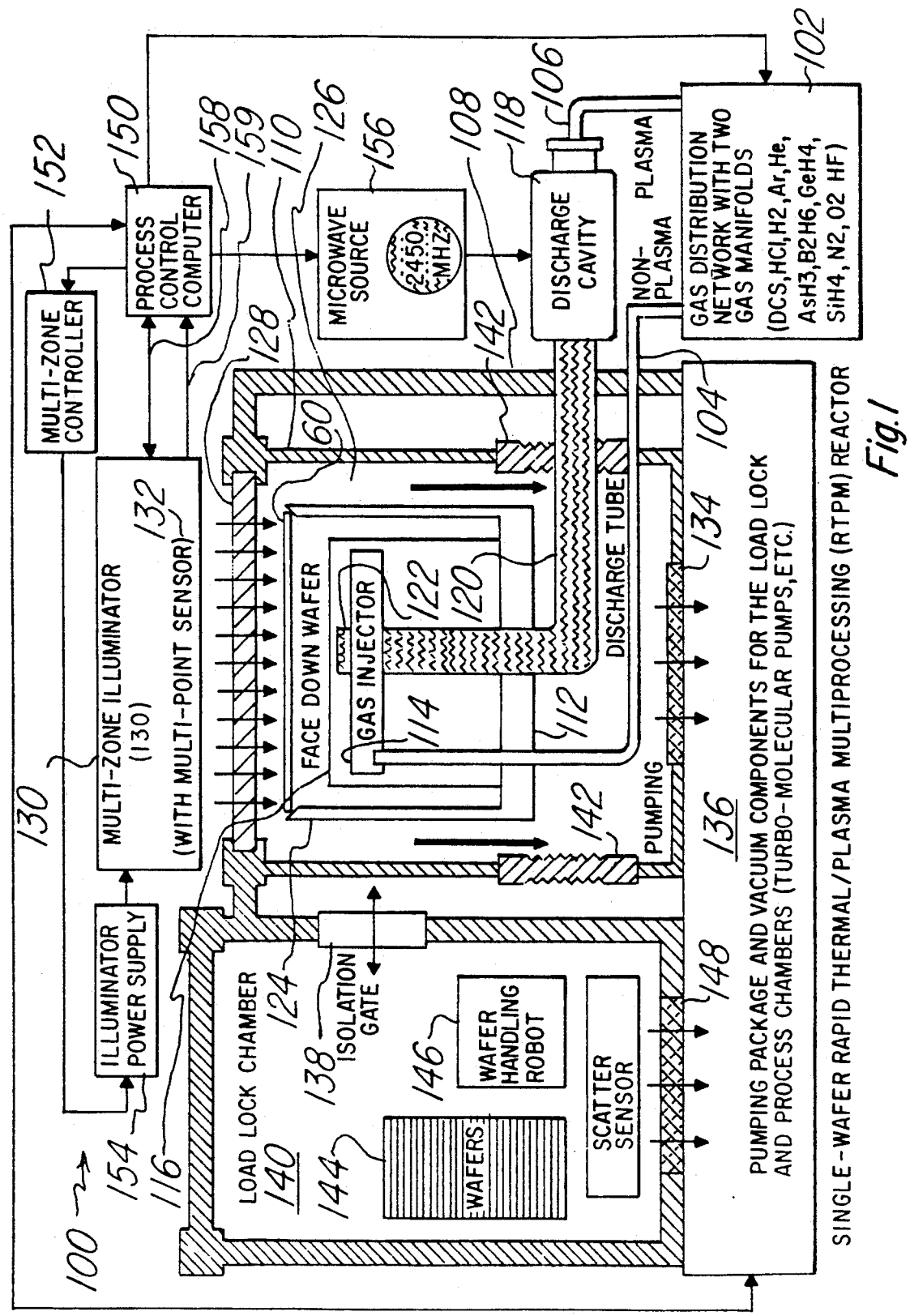
FIG. 1 is a schematic diagram of a single-wafer rapid thermal processing reactor for processing semiconductor devices using the present invention.

FIG. 1 is a schematic representation of a semiconductor processing reactor 100 that establishes the environment of the present invention. Within a single-wafer RTP reactor 100 such as the Texas Instruments' advanced automated vacuum processor (AVP), may reside semiconductor wafer 60. Beginning at the bottom right-hand corner of FIG. 1, gas distribution network 102 may comprise two gas manifolds: a non-plasma process gas manifold and a plasma manifold. Non-plasma gas manifold penetrates through reactor wall 108 via gas line 104 and process chamber wall 110 to proceed through ground electrode 112 and into gas injector 114. Plasma manifold connects into discharge cavity 118 via gas line 106 for generating process plasma. Process plasma activated species pass within plasma discharge tube 120 through reactor casing 108 and process chamber wall 110, through ground electrode 112 and into plasma injector 122 near nonplasma gas injector assembly 114. Above gas injector assembly 114 and supported by low thermal mass pins 124 appears semiconductor wafer 60. Low thermal mass pins 124 are supported by ground electrode 112 (or a liner, not shown) within process chamber 126. Wafer processing may be conducted with only thermal activation or with a combination of thermal and plasma process activation.

Process chamber 126 includes optical quartz window 128 which separates semiconductor wafer 60 from multi-zone illuminator 130 of the present invention. In association with multi-zone illuminator 130 may be multi-point temperature sensor 132 (not shown) as described in U.S. patent application Ser. No. 702,646 by M. Moslehi, et al. filed on Apr. 24, 1991 and assigned to Texas Instruments Incorporated. Vacuum pump connection 134 removes flowing process gas and plasma from process chamber 126 and into pumping package 136. Additionally, isolation gate 138 permits passage of semiconductor wafer 60 from vacuum load-lock chamber 140 into RTP process chamber 126. To permit movement of semiconductor wafer 60 into process chamber 126, chamber collar lift mechanism 142 supports process chamber collar 110.

Within vacuum load-lock chamber 140 appears cassette 144 of semiconductor wafers 60 from which wafer handling robot 146 removes a single semiconductor wafer 60 for processing. To maintain load-lock chamber 140 under vacuum, load-lock chamber 140 also includes vacuum pump connection 148.

Process control computer 150 controls the processing of semiconductor wafer 60 in RTP reactor 100. Control signals from process control computer 150 include signals to multi-zone controller 152. Controller (or multi-zone controller) 152 provides various signals to multi-zone lamp module power supply 154. Illuminator power supply 154 responsively provides power settings to multi-zone illuminator 130.

Process control computer 150 also directs pressure set points to pumping package 136 as well as gas and plasma inlet flow signals to mass-flow controllers in the gas distribution network 102. To provide proper activation of plasma species at discharge cavity 118, process control computer 150 provides a control signal to microwave source 156 which, in the preferred embodiment, operates at a frequency of 2450 MHZ.

Process control computer 150 checks the status of multi-zone illuminator 130 via line 158 for diagnosis/prognosis purposes and provides multiple temperature control signals to multi-zone controller 152 in response to temperature readings of multi-point sensors (not shown). The multi-zone controller receives measured multi-point temperature sensor outputs (not shown) as well as the desired wafer temperature setpoint (from computer) and delivers power setpoints to the lamp zone power supplies. Sensing lines 159 between process control computer 150 and multi-zone illuminator 130 of the present invention include signals from multi-point temperature sensor (not shown) for real-time semiconductor wafer 60 temperature measurements as well as the status of the zone lamps to monitor aging and failure of the lamps.

Figure 2:
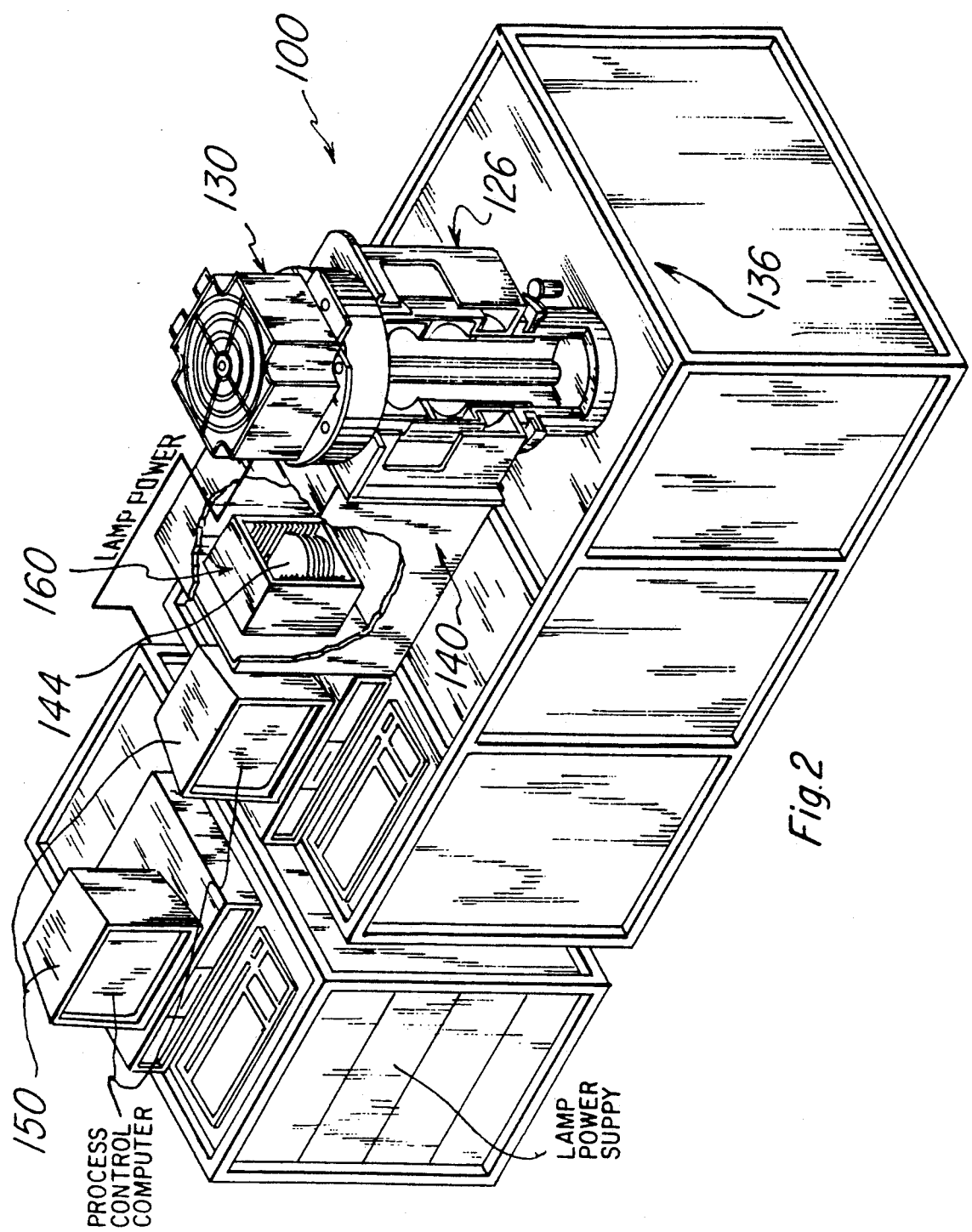
FIG. 2 is a partially cut-away schematic diagram of a preferred embodiment of the present invention in association with the processing chamber of FIG. 1.

FIG. 2 shows a perspective view of the Texas Instruments AVP or advanced/automated vacuum processor operating as an RTP reactor 100 for purposes of the present invention. Process chamber 126 is mounted on reactor frame 136. Process chamber 126 rigidly supports multi-zone illuminator 130. Adjacent to process chamber 126 is vacuum load-lock chamber 140 within which appears cassette 160 for holding semiconductor wafers 144. Adjacent to vacuum load-lock chamber 140 is process control computer 150 which controls the operation of the various elements associated processing reactor 100.

Figure 3:
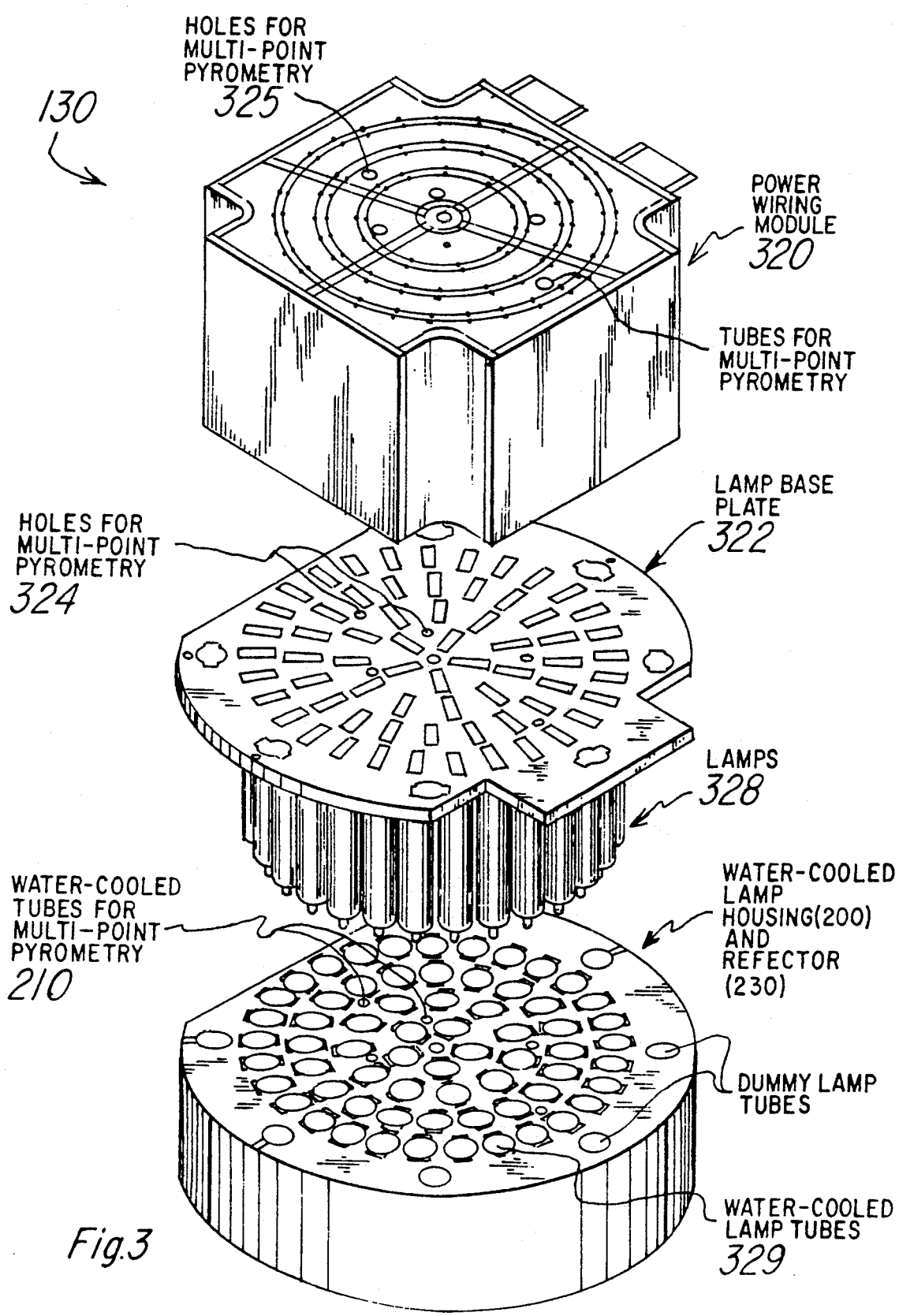
FIG. 3 shows a simplified view of a preferred embodiment of the multi-zone illuminator of the present invention.

FIG. 3 shows a schematic view of the main components of a multi-zone illuminator 130 of this invention (components shown separate from each other). The main components include a water-cooled lamp housing/reflector 200, an array of multi-zone heating lamps 328, a lamp socket base plate 322, and a power wiring module 320. The power wiring module 320 provides electrical connections between the lamp zones and external electrical power supplies (not shown). The base plate 322 holds all the lamp sockets. The multi-zone heating lamps 328 penetrate through the water-cooled lamp tubes 329 within the water-cooled lamp housing/reflector assembly 200. Additional water-cooled tubes 326 with a smaller diameter are included for insertion of a multi-point temperature sensor system for multi-zone lamp and temperature control. These sensors are inserted into the multi-zone illuminator assembly 130 through various holes 325, 324, 210, which are aligned between the power wiring module 320, lamp base plate 322, and water-cooled lamp housing/reflector 200.

Figure 4:
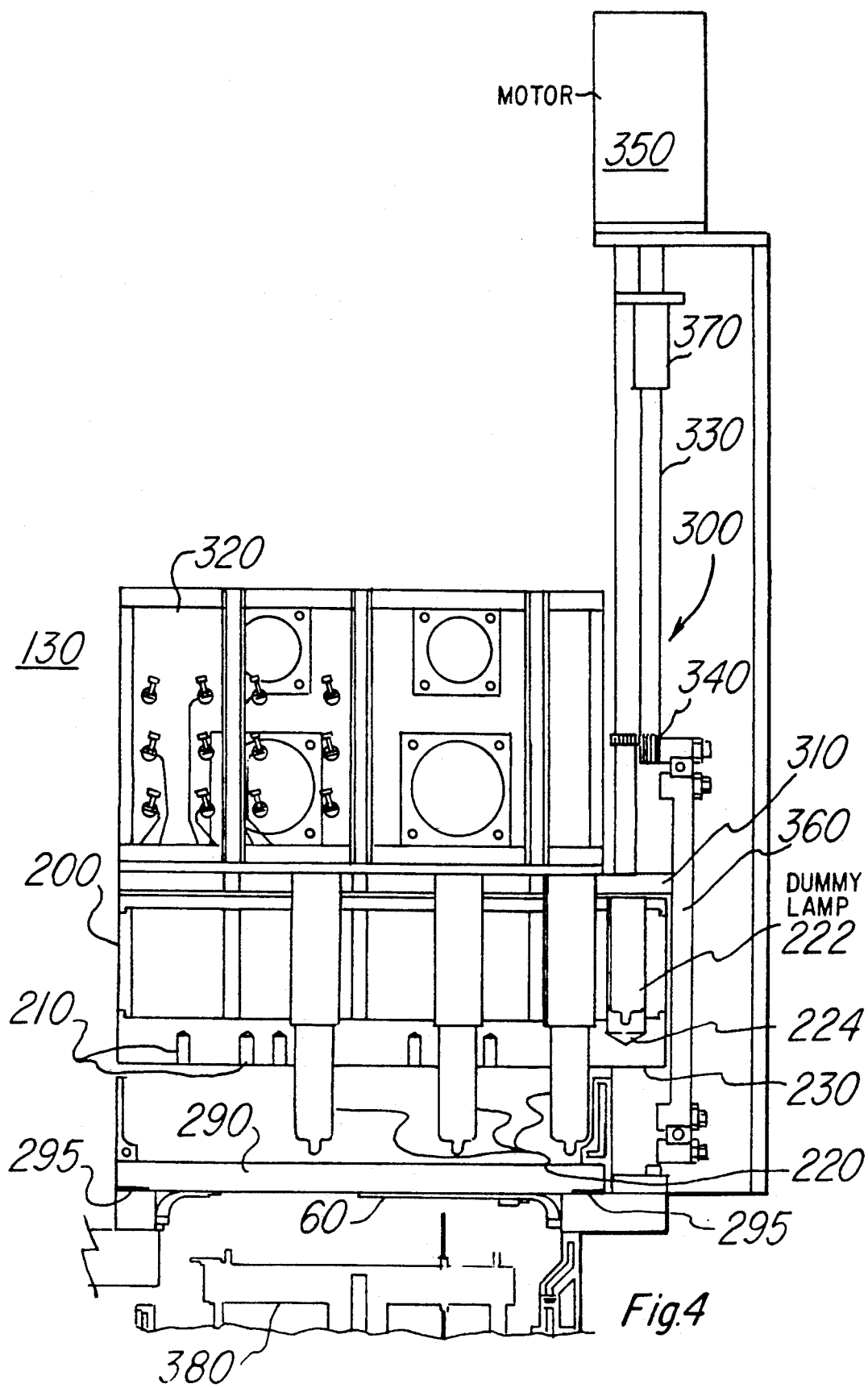
FIG. 4 is a schematic diagram of a front view of a multi-zone illuminator in accordance with the present invention.
Figure 5:
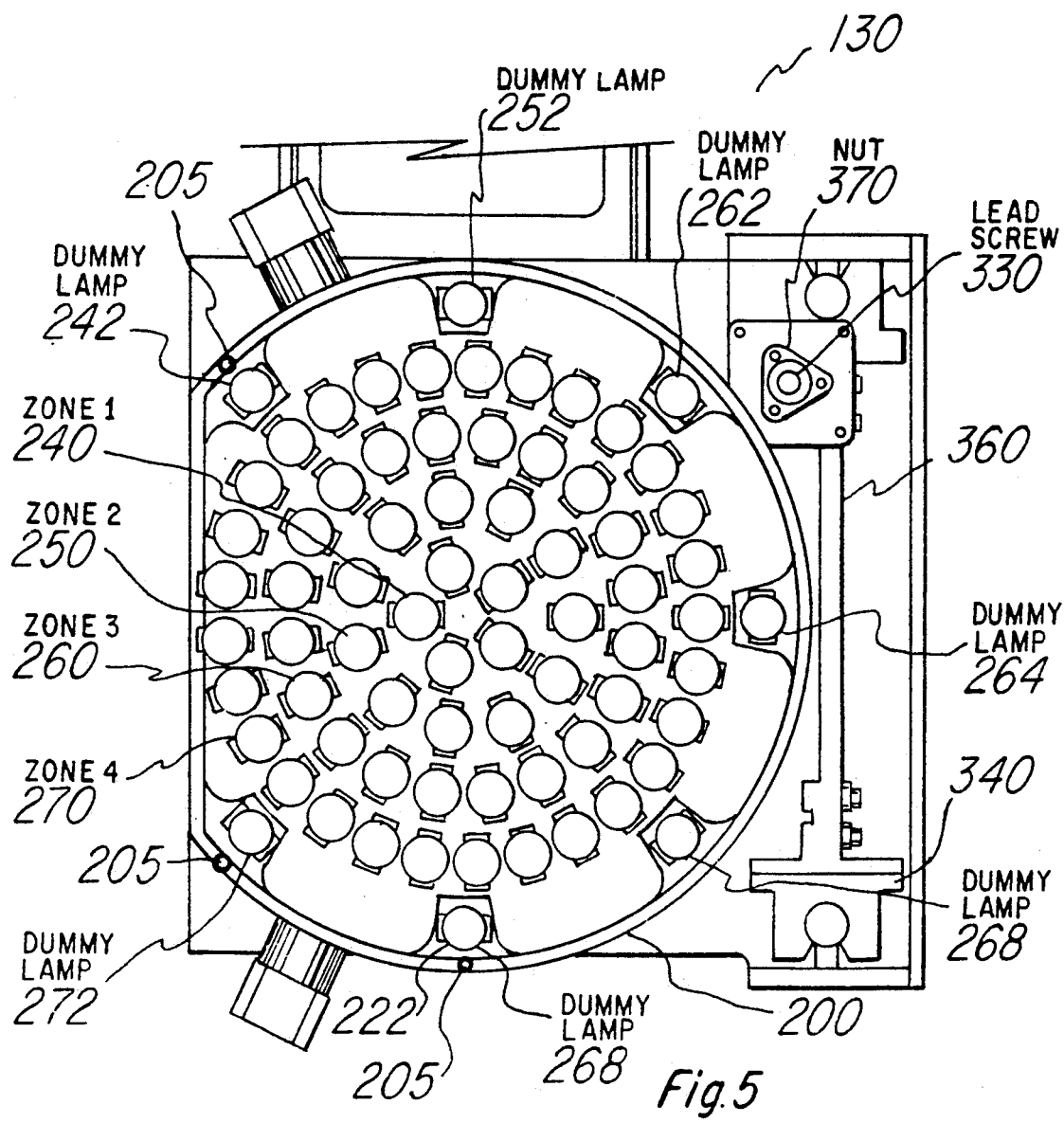
FIG. 5 is a schematic diagram of a bottom view of a multi-zone illuminator according to the present invention.

The preferred embodiment of the invention is shown more in detail in FIG. 4. The multi-zone illuminator 130 consists of a lamp housing 200 which has a series of open spaces or tubes through which an array of heating lamps 220 and dummy lamps 222 protrude. Dummy lamps 222 are shown in the periphery of housing 200 but they may be located elsewhere. On the bottom of housing 200 is a gold-plated reflector plate 230. Lamp housing 200 is water-cooled to prevent heating of the reflector 230 and the pyrometer light pipes 210. Referring to FIG. 5, the lamps 220 are arranged vertically as point sources along the axis of the illuminator, distributed over several concentric rings. The preferred embodiment uses four concentric rings, wherein each ring forms one heating zone. The number of rings (or zones) may be more or less than four. Zone 1 consists of 5 heating lamps 240 and a peripheral dummy lamp 242 located on the periphery of housing 200. Zone 2 consists of 11 heating lamps 250 and a dummy lamp 252 located on the periphery of housing 200. Zone 3 consists of 20 lamps 260 and four dummy lamps 262, 264, 266, and 268 located on the periphery of housing 200. Zone 4 consists of 29 lamps 270 and a dummy lamp 272 located on the periphery of housing 200. In the preferred embodiment lamps 220 are each 1 KW tungsten-halogen lamps. However, it should be noted that lamp ratings of 500 watts, 750 watts, 2 kw or even more may also be used. Other types of lamps different from the tungsten-halogen type may also be used.

Figure 6:
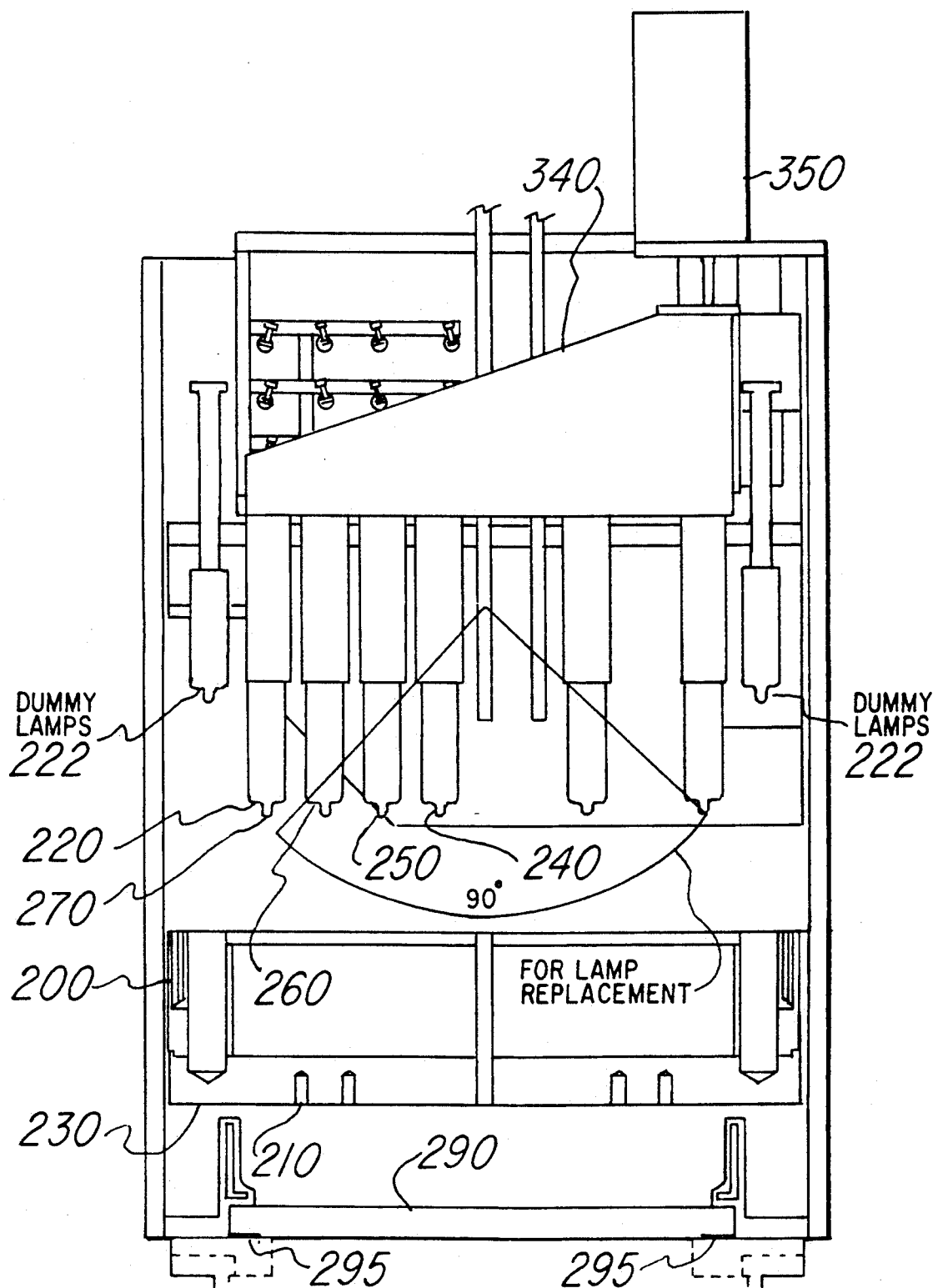
FIG. 6 is schematic diagram of a side view of a multi-zone illuminator according to the present invention.
Figure 7A:
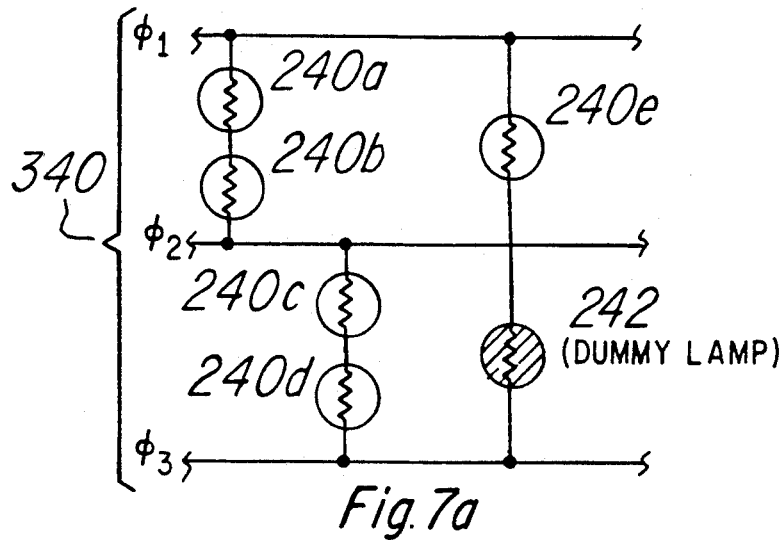
FIG. 7a-d are a schematic diagram of the power distribution system according to the present invention.
Figure 7B:
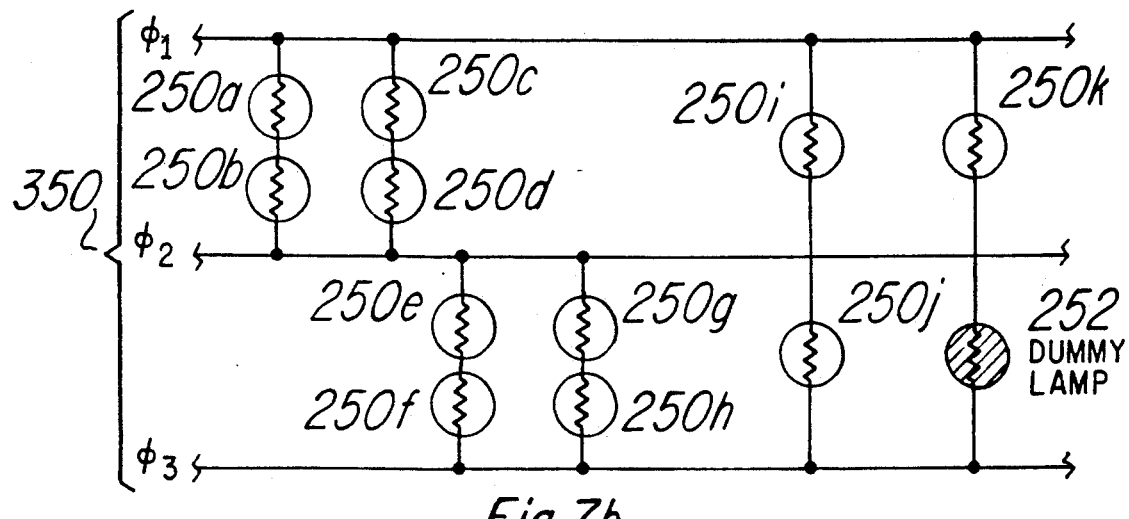
Figure 7C:
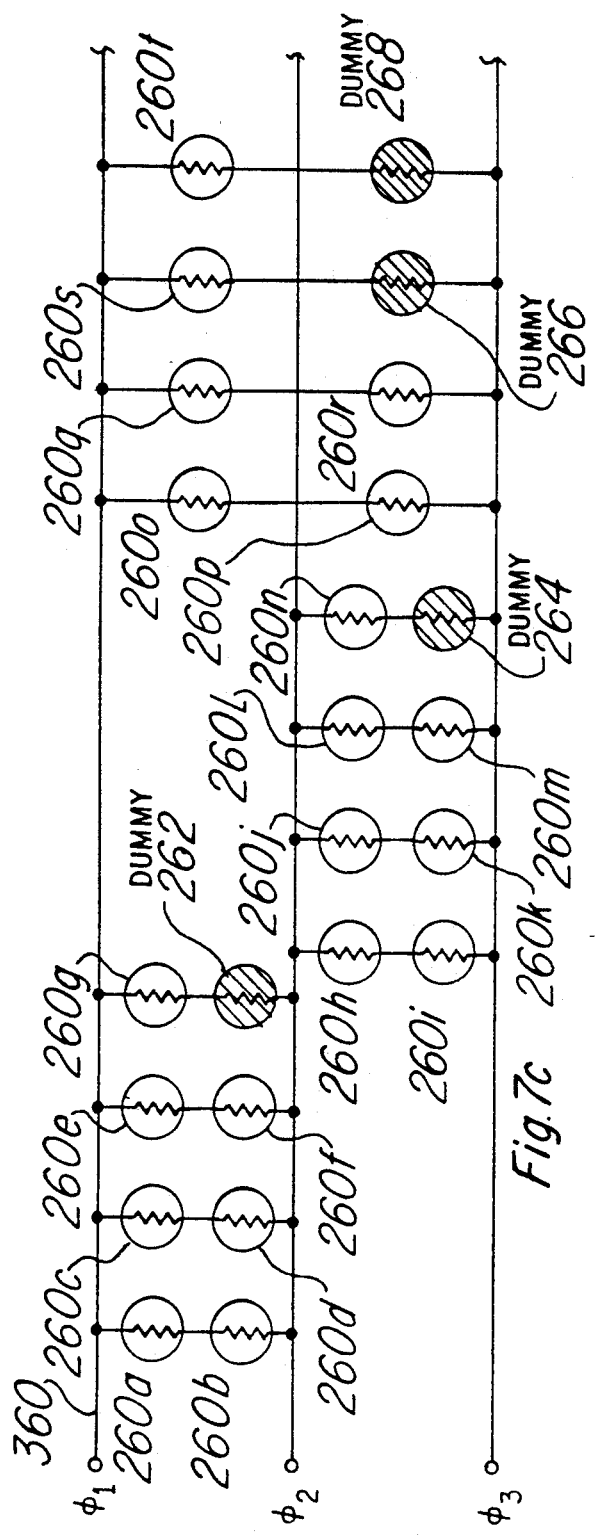
Figure 7D:
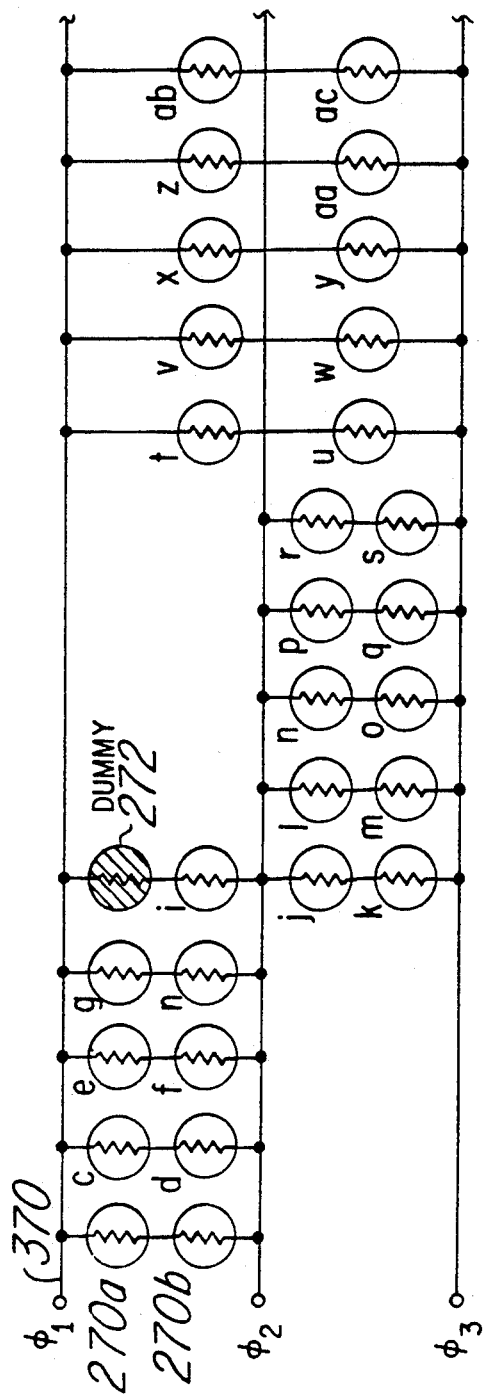

Referring to FIG. 4, housing 200 is located above and separate from wafer 60 by optical window 290. Optical window 290 may be made of quartz or another transparent material. On the peripheral bottom edge of optical window 290 is a reflective film coating 295. The reflective film 295 may be of, for example chromium and may be used to prevent direct exposure of the vacuum 0-ring seals to lamp light. The distance between reflector plate 230 and wafer 60 and the distance between heating lamps 220 and wafer 60 is adjusted by adjustable elevator 300 and an adaptor ring placed between the lamp housing 200 and the quartz window 290. Motor 350 drives lead screw 330 which itself drives (raises or lowers) nut 370. Nut 370 is connected to carriage 202. Carriage 202 is connected to wiring module 320 and lamp support. This mechanism raises or lowers the lamp array with respect to the main lamp housing 200 (reflector 230). A separate mechanism (not shown) is provided to adjust the spacing between the lamp reflector 230 and the quartz window 290. The elevator mechanism 300 can be used for two purposes: (i) to adjust the relative spacing between the lamp array and the quartz window 290 (with a given reflector-to-quartz spacing); and (ii) to raise the entire lamp array and associated wiringmmodule 320 out of the main lamp housing 200 (watercooled reflector 230). The latter will allow rotating the lamp array in order to replace lamps. As a result, the overall optical flux of the illuminator and its distribution pattern can be optimized for a wide range of process parameters, including chamber pressure and total gas flow rate. FIG. 4 shows lamp housing 200 at a typical position near optical window 290. FIG. 6, shows illuminator 130 from a side view, indicating the radial positions of various lamps in four concentric zones, as well as the pivot for rotation of the illuminator assembly for maintenance.

Power supplies 340 through 370 are three phase power supplies. Referring to FIG. 7, Zone 1 is powered by power supply 340. Lamps 240 may be connected as follows: Lamps 240a and 240b connected in series between phase 1 and phase 2, lamps 240c and 240d connected in series between phase 2 and phase 3, lamp 240e and dummy lamp 242 connected in series between phase 1 and phase 3.

Referring to FIG. 7, zone 2 is powered by power supply 350. Between phases 1 and 2 lamps 250a and 250b are connected in series, and lamps 250c and 250d are connected in series. Between phases 2 and 3 lamps 250e and 250f are connected in series and lamps 250g and 250h are connected in series. Between phases 1 and 3 lamps 250i and 250j are connected in series, and lamp 250k and dummy lamp 252 are connected in series.

Referring to FIG. 7, zone 3 is powered by power supply 360. Between phases 1 and 2 the following pairs of lamps may be connected in series: 260a and 260b, 260c and 260d, 260e and 260f, 260g and dummy lamp 262. Between phases 2 and 3 the following pairs of lamps may be connected in series: 260h and 260i, 260j and 260k, 260l and 260m, 260n and dummy lamp 264. Between phases 1 and 3 the following pairs of lamps may be connected in series: 260o and 260p, 260q and 260r, 260s and dummy lamp 266, 260t and dummy lamp 268.

Referring to FIG. 7, zone 4 is powered by power supply 370. Between phases 1 and 2 the following pairs of lamps may be connected in series: 270a and 270b, 270c and 270d, 270e and 270f, 270g and 270h, 270i and dummy lamp 272. Between phases 2 and 3 the following pairs of lamps may be connected in series: 270j and 270k, 270l and 270m, 270n and 270o, 270p and 270q, 270r and 270s. Between phases 1 and 3 the following pairs of lamps may be connected in series: 270t and 270u, 270v and 270w, 270x and 270y, 270z and 270aa, 270ab and 270ac. The above described connection is an example only. As will be apparent to those skilled in the art, other combinations are possible (depending on the power supply and lamp voltage ratings).

Lamps 220 may, for example, be tungsten-halogen or plasma arc lamps and are used to heat the semiconductor wafer 60 during processing. The concentric rings of lamps 220 in the preferred embodiment provide as much as 65 kw of power for RTP. Because of the multiple lamp sources in each zone and their proximity to one another, each zone provides a continuous photon radiation ring at the surface of wafer 200 and results in uniform wafer heating. Using multiple independent point source lamps in a zone and connecting them to one power supply is significantly less complicated and more economical and practical than providing a single ring shaped lamp.

Dummy lamps 222 are identical to lamps 220 except that they are placed in housing 200 such that their output radiation is isolated from the wafer 60. The isolation is accomplished by blocking the end sections of the dummy light pipes with a cap 224 as shown in FIG. 4. The purpose of dummy lamps 242, 252, 262, 264, 266, 268, and 272 is to measure the light modulation depth as is described below, for the purpose of precise pyrometry-based temperature measurement.

Multi-point temperature sensors, such as those described in U.S. patent application Ser. No. 702,646 filed Apr. 24, 1991, can be used to perform real-time temperature measurement and uniformity control during transient and steady-state thermal cycles. However, lamps producing radiance with infrared wavelengths of less than 3.5 microns are desired because the quartz window 290 is transparent at those wavelengths. At wavelengths of less than 3.5 microns, pyrometry measurements are, however, subject to lamp interference effects which can cause significant temperature measurement errors and process repeatability problems. Thus, a light interference elimination circuit (LIEC) is desired.

Figure 8:
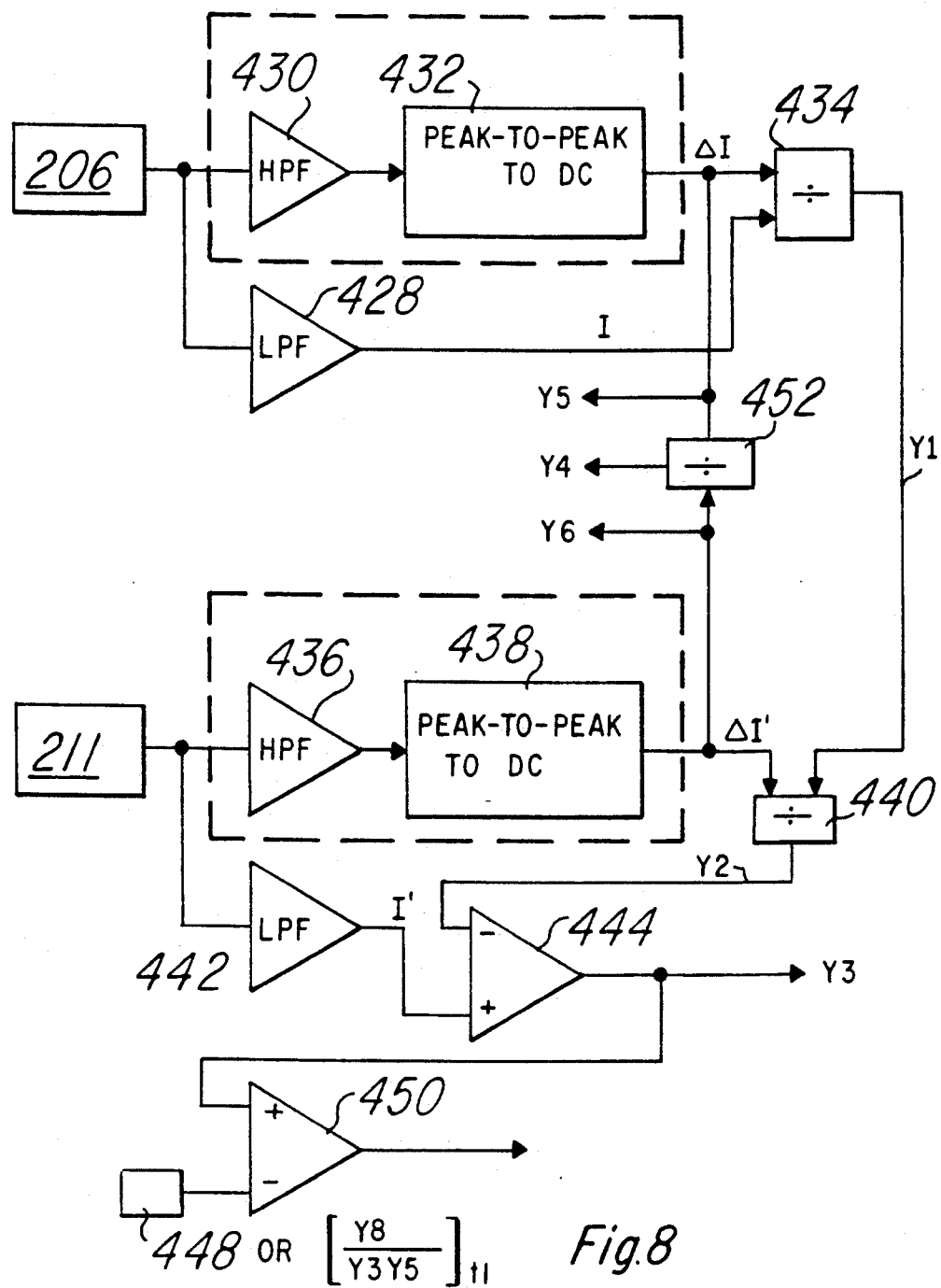
FIG. 8 is a block diagram showing the operation of the light interference elimination circuit (LIEC) in accordance with the present invention.

Each dummy lamp includes a light interference eliminator circuit (LIEC) pyrometer insert light pipe 205 for LIEC modulation depth measurement and control for their respective zones. Dummy light pyrometers 206 (shown in FIG. 8) associated with light pipes 205 measure the radiation from the dummy lamps 222. Multiple pyrometer insert light pipes 210 are also embedded in housing 200 for up to 5 or more radial wafer temperature measurements. Wafer pyrometers 211 associated with light pipes 210 measure radiation from both the lamps 220 (due to their interference) and wafer 60. A power modulation source (not shown) is provided for modulating the electrical power source to a selected modulation depth such that the output radiation of the dummy lamps 222 varies with the selected AC modulation but the temperature of the wafer 60 remains substantially constant. Circuitry is provided for determining the fraction of total radiation collected by pyrometers associated with light pipes 210 which is emitted by the wafer heating lamps 220 and calculating the true temperature of wafer 60. Referring now to FIG. 8, a sample or portion of the spectral power of the lamp radiation is measured by a dummy lamp pyrometer 206. The spectral power includes an AC component $\Delta I$ (for reference, $\Delta I$ is the peak-to-peak AC signal) and the DC component I. The dummy lamp pyrometers 206 operate in the same spectral band $\Delta\lambda$, and therefore the same center wavelength, as the wafer pyrometers. As an example, $\lambda_0$ may be 3.3 $\mu$m and $\Delta\lambda$ may be 0.4 $\mu$m.

A lamp pyrometer output signal is provided to a low-pass filter 428 which outputs the DC component I. The dummy lamp pyrometer 206 output is also provided to a high-pass filter 430 and a peak-to-peak to DC converter 432 which in turn outputs the AC portion of the lamp intensity $\Delta I$. (Note: If desired, both blocks 430 and 432 can be bypassed without affecting the functionality of LIEC).

The lamp radiation modulation depth $M_L$ is determined by dividing the peak-to-peak value of the AC component $\Delta I$ of the dummy lamp pyrometer 206 by its DC component I in divider 434.

At the same time, the AC component $\Delta I'$, of a wafer pyrometer 211 is determined from high-pass filter 436 and peak-to-peak to DC converter 438. The AC component $\Delta I'$ of the wafer pyrometer 211 is then divided by the measured lamp modulation depth $M_L$ in dividing circuit 440. The output $Y_2$ of the divider is the amount of DC lamp interference, i.e., the main source of measurement error in the wafer temperature sensor or wafer pyrometer 211. Again, blocks 436 and 438 are eliminated/bypassed if blocks 430 and 432 are eliminated/bypassed.

The lamp interference effect or $Y_2$ may be subtracted from the DC component I' from the wafer pyrometer 211 (obtained from low-pass filter 442) in difference or differential amplifier circuitry 444. The output $Y_3$ of the difference circuit 444 is based on the true wafer temperature and substantially all lamp interference portion has been eliminated.

This technique also provides real-time data on spectral wafer reflectance (or emissivity) in the spectral band of the pyrometer. This information can be used for real-time correction/compensation of wafer temperature measurement using pyrometry. The spectral reflectance is essentially proportional to the ratio of the AC signal level $\Delta I'$ detected by the wafer pyrometer 211 to the AC signal level $\Delta I$ detected by the dummy lamp pyrometer 206. The emissivity is proportional to the output of 452, labeled as $Y_4$ in FIG. 5. $Y_4$ is a measure of the wafer spectral emissivity at the same center wavelength as the pyrometers. A more detailed description of the operation of a LIEC (without embedded dummy lamps) is described in co-pending U.S. patent application Ser. No. 785,386, filed Oct. 30, 1991 and assigned to Texas Instruments, Inc and is hereby incorporated by reference.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multi-zone illuminator for processing semiconductor wafers comprising:
   a. a lamp housing having a bottom side;
   b. a plurality of point source lamps embedded in said bottom side, said lamps arranged in a plurality of concentric circular zones for generating and directing optical energy;
   c. a reflector plate attached to said bottom side for reflecting and directing optical energy; and
   d. a light interference elimination circuit (LIEC) including at least one dummy lamp embedded in said bottom side for measuring light modulation depth, wherein at least one dummy lamp is associated with at least one of said plurality of concentric circular zones.

2. The apparatus of claim 1 further comprising:
   a. a plurality of light pipes embedded in said bottom side; and
   b. a light pipe located in at least one of said dummy lamps for each zone.

3. The apparatus of claim 2, wherein said light interference elimination circuit comprises:
   a plurality of wafer temperature sensors insertable in said plurality of light pipes embedded in said bottom side;
   b. a plurality of lamp radiance sensors insertable in said light pipes located in said dummy lamps;
   c. a modulation source for modulating said heating lamps and dummy lamps to a selected modulation depth and frequency;
   d. circuitry to determine the magnitude of the modulation depth of the radiation detected in at least one of said plurality of lamp radiance sensors;
   e. circuitry to determine the magnitude of the lamp interference signals embedded in said plurality of wafer temperature sensors; and
   f. circuitry to subtract said lamp interference signals from said wafer temperature sensor signals to determine the wafer temperature.

4. The apparatus of claim 1, wherein said source lamps are associated within each of said circular zones to provide an approximately continuous ring of said optical energy from each of said circular zones at the semiconductor wafer surface.

5. The apparatus of claim 1, wherein said illuminator comprises a plurality of cooling channels for flowing a cooling fluid to cool said reflector.

6. The apparatus of claim 1, further comprising a plurality of adjustable power supplies, each of said adjustable power supplies associated to provide electrical power to a respective lamp zone.

7. The apparatus of claim 6 wherein each power supply also provides power to at least one dummy lamp.

8. The apparatus of claim 1, wherein said source lamps comprise tungsten-halogen lamps.

9. The apparatus of claim 1, wherein each of said source lamps comprise a 500 to 2000 watt tungsten-halogen lamp.

10. The apparatus of claim 1 further including a means for adjusting the spacing between said lamps and said wafer.

11. The apparatus of claim 10 wherein said means for adjusting is also capable of adjusting the spacing between said reflector plate and said wafer wherein the spacing between the lamps and the wafer may be adjusted independently of the spacing between the reflector plate and the wafer.

12. The apparatus of claim 1 wherein said reflector plate is flat and gold plated.

13. A multi-zone illuminator for processing semiconductor wafers comprising:
   a. a lamp housing having a bottom side;
   b. a plurality of source lamps embedded in said bottom side, said lamps arranged in a four concentric circular zones wherein each zone provides a nearly continuous ring of optical energy for uniform wafer heating;
   c. a plurality of adjustable power supplies, each of said adjustable power supplies associated to provide electrical power to a respective concentric circular zone;
   d. a plurality of dummy lamps embedded in said bottom side for measuring light modulation depth, wherein at least one dummy lamp is powered by each power supply and includes a light pipe for receiving one of a plurality of first fiber-optic radiance sensors;
   e. a plurality of light pipes embedded in said bottom side for receiving a plurality of second fiber-optic wafer temperature sensors;
   f. a flat gold-plated reflector plate attached to said bottom side for reflecting and directing optical energy; and
   g. a means for adjusting the lamp-to-wafer spacing and the reflector to wafer spacing.

14. The apparatus of claim 13, wherein said four concentric lamp zones comprise an outer circular lamp zone having 29 point-source lamps, an outer middle circular lamp zone having 20 point-source lamps, an inner middle circular zone having 11 point-source lamps, and a center circular zone having five point-source lamps.

15. The apparatus of claim 13, further comprising:
   a. a modulation source for modulating said lamps and dummy lamps to a selected modulation depth and frequency;
   b. circuitry to determine the magnitude of the modulation depth of the radiation detected in at least one of said plurality of first fiber-optic sensors;
   c. circuitry to determine the magnitude of the lamp interference of signals embedded in said plurality of second fiber-optic sensors; and
   d. circuitry to subtract said lamp interference signals from said wafer temperature sensor signals to determine the true wafer temperature.

16. The apparatus of claim 13, wherein said housing comprises a plurality of cooling channels for flowing a cooling fluid to cool said reflector and said light pipes.

17. The apparatus of claim 13, wherein said source lamps comprises tungsten-halogen lamps.

18. The apparatus of claim 13, wherein each of said point-source lamps comprise a 500 to 2000 watt tungsten-halogen lamp.

19. The apparatus of claim 13, wherein said four concentric lamp zones comprise an outer circular lamp zone having 29 source lamps, an outer middle circular lamp zone having 20 source lamps, an inner middle circular lamp zone having 11 source lamps, and a center circular zone having five source lamps.

20. A rapid thermal processor adapted to process a semiconductor wafer, said processor comprising:
   a. a quartz window above said wafer; and
   b. a multi-zone illuminator located above said quartz window comprising:
      i. a lamp housing having a bottom side;
      ii. a plurality of point source lamps embedded in said bottom side, said lamps arranged in four concentric circular zones wherein each zone provides a nearly continuous ring of optical energy for uniform wafer heating;
      iii. a plurality of adjustable power supplies, each of said adjustable power supplies associated to provide electrical power to a respective concentric circular zone;
      iv. a light interference elimination circuit (LIEC) including a plurality of dummy lamps embedded in said bottom side for measuring light modulation depth, wherein at least one dummy lamp is powered by each power supply and includes a light pipe for receiving one of a plurality of first fiber-optic sensors;
      v. a flat gold-plated reflector plate attached to said bottom side for reflecting and directing optical energy; and
      vi. a means for adjusting the lamp to wafer spacing and the reflector-to-wafer spacing.

* * * * *